US 9,508,860 B2

(12) United States Patent
Tang

(10) Patent No.: US 9,508,860 B2
(45) Date of Patent: Nov. 29, 2016

(54) LATERAL GATE ELECTRODE TFT SWITCH AND LIQUID CRYSTAL DISPLAY DEVICE

(71) Applicant: SHENZHEN CHINA STAR OPTOELECTRONICS TECHNOLOGY CO., LTD., Shenzhen, Guangdong (CN)

(72) Inventor: Yuejun Tang, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 14/417,531

(22) PCT Filed: Jan. 13, 2015

(86) PCT No.: PCT/CN2015/070631
§ 371 (c)(1),
(2) Date: Jan. 30, 2015

(87) PCT Pub. No.: WO2016/106844
PCT Pub. Date: Jul. 7, 2016

(65) Prior Publication Data
US 2016/0190340 A1    Jun. 30, 2016

(30) Foreign Application Priority Data

Dec. 31, 2014 (CN) .................... 2014 1 0853857

(51) Int. Cl.
*H01L 23/62* (2006.01)
*H01L 29/786* (2006.01)
*H01L 29/423* (2006.01)

(52) U.S. Cl.
CPC ... *H01L 29/78642* (2013.01); *H01L 29/42356* (2013.01); *H01L 29/78663* (2013.01)

(58) Field of Classification Search
CPC ........... H01L 21/048; H01L 21/28158; H01L 27/124; H01L 27/3248; H01L 27/1251; H01L 29/4908; H01L 29/7869; H01L 51/102; H01L 51/0508
USPC .......... 257/359, 288, 79, 104, 387, E21.006, 257/E21.045, E21.046, E21.051, E21.053, 257/E21.061, E21.062, E21.352, E21.366, 257/E21.411
See application file for complete search history.

(56) References Cited

U.S. PATENT DOCUMENTS

| 5,508,216 | A | * | 4/1996 | Inoue | ................. H01L 27/1214 257/344 |
| 5,563,427 | A | * | 10/1996 | Yudasaka | ............ G02F 1/13454 257/72 |
| 5,811,836 | A | * | 9/1998 | Ha | .................... G02F 1/136227 257/59 |

(Continued)

*Primary Examiner* — David Nhu
(74) *Attorney, Agent, or Firm* — Hauptman Ham, LLP

(57) ABSTRACT

A lateral gate electrode TFT switch and a liquid crystal display device are disclosed. The lateral TFT switch has a substrate, a source-drain area, a gate insulation layer and a gate electrode. The source-drain area is disposed on the substrate and has a source electrode, a drain electrode and a semiconductor layer. The semiconductor layer is disposed between the source electrode and the drain electrode. The source electrode and the drain electrode are vertically disposed on the substrate. The gate insulation layer is disposed adjacent to the source-drain area. The gate electrode is disposed adjacent to the gate insulation layer. The gate insulation layer is used to separate the source-drain area from the gate electrode.

13 Claims, 8 Drawing Sheets

(56) References Cited

U.S. PATENT DOCUMENTS 5,953,582 A * 9/1999 Yudasaka ............ G02F 1/13454
        438/29
8,130,209 B2 * 3/2012 Chang ................... G06F 3/0412
        345/174
8,466,030 B2 * 6/2013 Park .................. H01L 21/26513
        438/303

* cited by examiner

FIG. 4

| G | ~160 |
|---|---|
| GI | ~150 |
| S | ~120 |
| n+ | ~130' |
| a-Si | ~140 |
| n+ | ~130 |
| D | ~110 |
| Glass | ~170 |

LATERAL GATE ELECTRODE TFT SWITCH AND LIQUID CRYSTAL DISPLAY DEVICE

BACKGROUND OF THE INVENTION

Field of Invention

The present invention relates to a lateral gate electrode TFT (Thin Film Transistor) switch and a liquid crystal display device, and more particularly to, a TFT switch used for raising a charging capacity thereof, downsizing a volume thereof and raising the aperture ratio thereof.

Description of Prior Art

With the development of liquid crystal display technology, the PPI (pixel per inch) of panels is progressively increased. Sequentially to increase the aperture ratio, the TFT switches is downsized less and less in the manufacture so that the charging capacity of pixel electrodes needs to be increased with following. There are a few methods to raise the charging capacity of the pixel electrodes: 1. Manufacturing large sized TFTs and choosing a larger W/L (width/length) ratio, especially in products of the automobile and the industrial control will adopt these method, however, the aperture ratio is sacrificed thereof; 2. Selecting a higher mobility technology by using semiconductor technology, such as LTPS (Low Temperature Poly Silicon), IGZO (Indium Gallium Zinc Oxide); the charging capacity is raised, however, the manufacturing process is complicated and the manufacturing defect-rate is increased.

FIG. 1 shows a detailed structural diagram of the TFT 10 of the conventional technology. Sequentially, from bottom to top, are a gate electrode 16, a gate insulation layer 15 and an a-Si layer 14. The active layer 14 is disposed with two ohm-contact layers (n+) 13 where a source electrode 11 and a drain electrode 12 are individually disposed. In the conventional structure, it is impossible to raise the charging capacity and raise the aperture ratio, simultaneously.

Hence, it is necessary to provide a lateral gate electrode TFT switch and a manufacturing method using the same to solve the problem of the conventional technology.

SUMMARY OF THE INVENTION

An objective of the present invention is to provide a lateral gate electrode TFT switch, which is able to raise a charging capacity of the TFT switch, downsize a volume of the TFT switch and raise an aperture ratio thereof.

To achieve the above objective, the present invention provides a lateral gate electrode TFT switch and a liquid crystal display device, the lateral gate electrode TFT switch comprises a substrate, a source-drain area, a gate insulation layer, and a gate electrode.

The source-drain area is disposed on the substrate and comprises a source electrode, a drain electrode, and a semiconductor layer. The semiconductor layer is disposed between the source electrode and the drain electrode. The source electrode and the drain electrode are vertically disposed on the substrate. The gate insulation layer is disposed adjacent to the source-drain area. The gate electrode is disposed adjacent to the gate insulation layer. The gate insulation layer is used to separate the source-drain area from the gate electrode.

In one embodiment, the gate insulation layer and the gate electrode are disposed directly on the substrate.

In one embodiment, the semiconductor layer comprises a first ohm-contact layer, an active layer, and a second ohm-contact layer.

In one embodiment, the first ohm-contact layer and the second ohm-contact layer have the same or different materials.

In one embodiment, the source electrode directly contacts with the substrate.

In one embodiment, the drain electrode directly contacts with the substrate.

In one embodiment, the lateral gate electrode TFT switch further comprises an insulation layer which is disposed between the source electrode and the semiconductor layer.

In one embodiment, a conductive channel is formed on a portion, without disposition of the insulation layer, between the source electrode and the semiconductor layer.

In one embodiment, the source electrode and the drain electrode transmit current via the conductive channel, while the gate electrode is applied with a driving voltage.

Correspondingly, one embodiment of the present invention also provides a liquid display device which comprises the lateral gate electrode TFT switch as mentioned before.

By the technical proposal of the present invention, a beneficial technical effect is affected that with the vertical arrangement of the source electrode and the drain electrode and the arrangement of the lateral gate, it is capable to raise a charging capacity of the TFT switches, downsize the volume of the TFT switches, and raise the aperture ratio thereof.

BRIEF DESCRIPTION OF THE DRAWINGS

FIG. 4 shows a manufacturing process of the lateral gate electrode TFT of the first embodiment of the present invention.

DETAILED DESCRIPTION OF THE PREFERRED EMBODIMENTS

Figure 1:
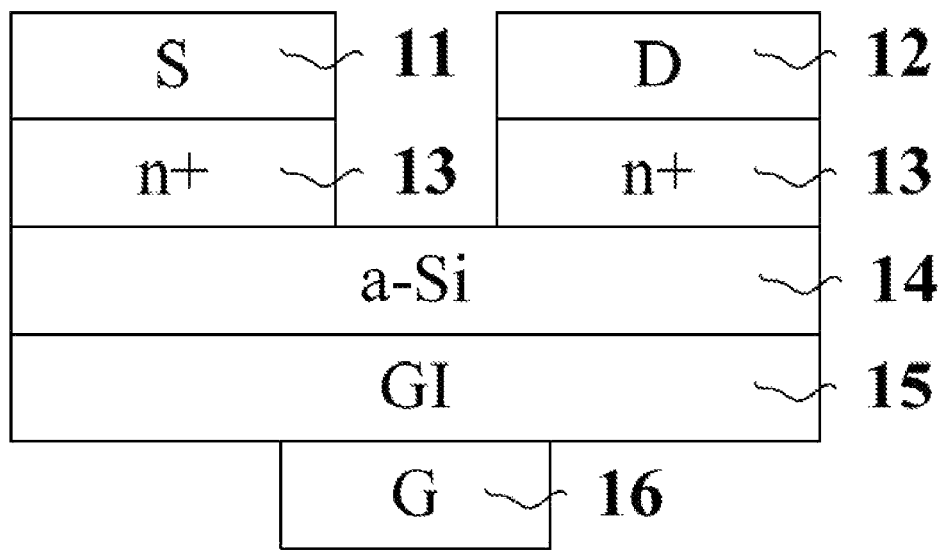
FIG. 1 shows a detailed structural diagram of the TFT of the conventional technology.

The following description of each embodiment, with reference to the accompanying drawings, is used to exemplify specific embodiments which may be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, units with similar structures are marked with the same labels.

Figure 2:
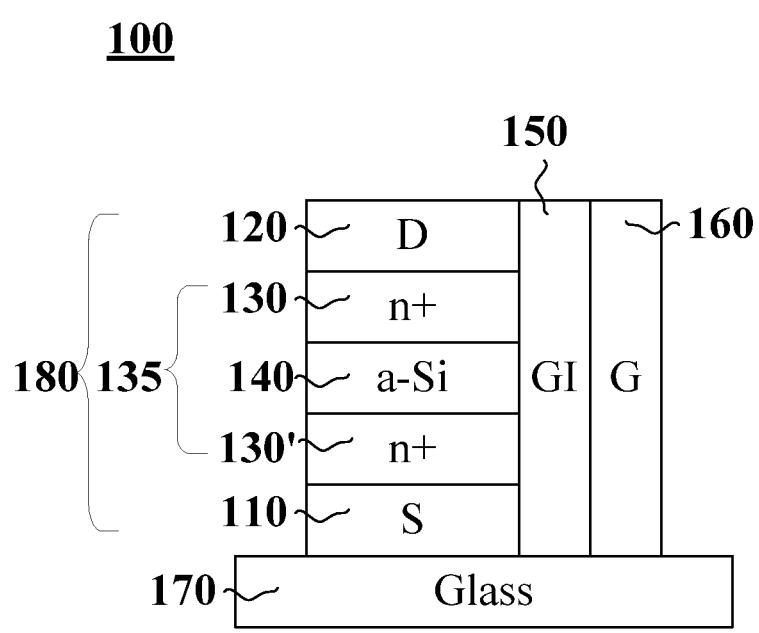
FIG. 2 shows a detailed structural diagram of a first aspect of a lateral gate electrode TFT of a first embodiment of the present invention.

FIG. 2 shows a detailed structural diagram of a first aspect of a lateral gate electrode TFT 100 of a first embodiment of the present invention. The lateral gate electrode TFT switch 100 comprises a substrate (glass) 170, a source-drain area 180, a gate insulation layer 150, and a gate electrode 160.

The source-drain area 180, (380 in FIG. 7), the gate insulation layer 150, and a gate electrode 160 are disposed on the substrate 170. The source-drain area 180 comprises a source electrode 110, a drain electrode 120, and a semiconductor layer 135 (235 in FIG. 5; 335 in FIG. 7; 435 in FIG. 8). The semiconductor layer 135 comprises a first ohm-contact layer 130, an active layer 140, and a second ohm-contact layer 130'. The semiconductor layer 135 is disposed between the source electrode 110 and the drain electrode 120. The gate insulation layer 150 (350 in FIG. 7; 450 in FIG. 8) is disposed adjacent to the source-drain area 180 and directly disposed on the substrate 170, for separating the source-drain area 180 from the gate electrode 160. The gate electrode 160 is disposed adjacent to the gate insulation layer 150 and directly disposed on the substrate 170. As shown in FIG. 2, with reference to the substrate 170, the source electrode 110, the first ohm-contact layer 130, the active layer 140, the second ohm-contact layer 130', and the drain electrode 120 are disposed along a vertical direction to form the source-drain area 180, sequentially. With reference to the substrate 170, the source-drain area 180, the gate insulation layer 150 and the gate electrode 160 are disposed along a horizontal direction, sequentially.

In the source-drain area 180, the semiconductor layer 135 (in other words, the active layer 140, the first ohm-contact layer 130, and the second ohm-contact layer 130') will form a conductive channel to transmit current, while the gate electrode 160 is applied with a driving voltage.

Figure 3:
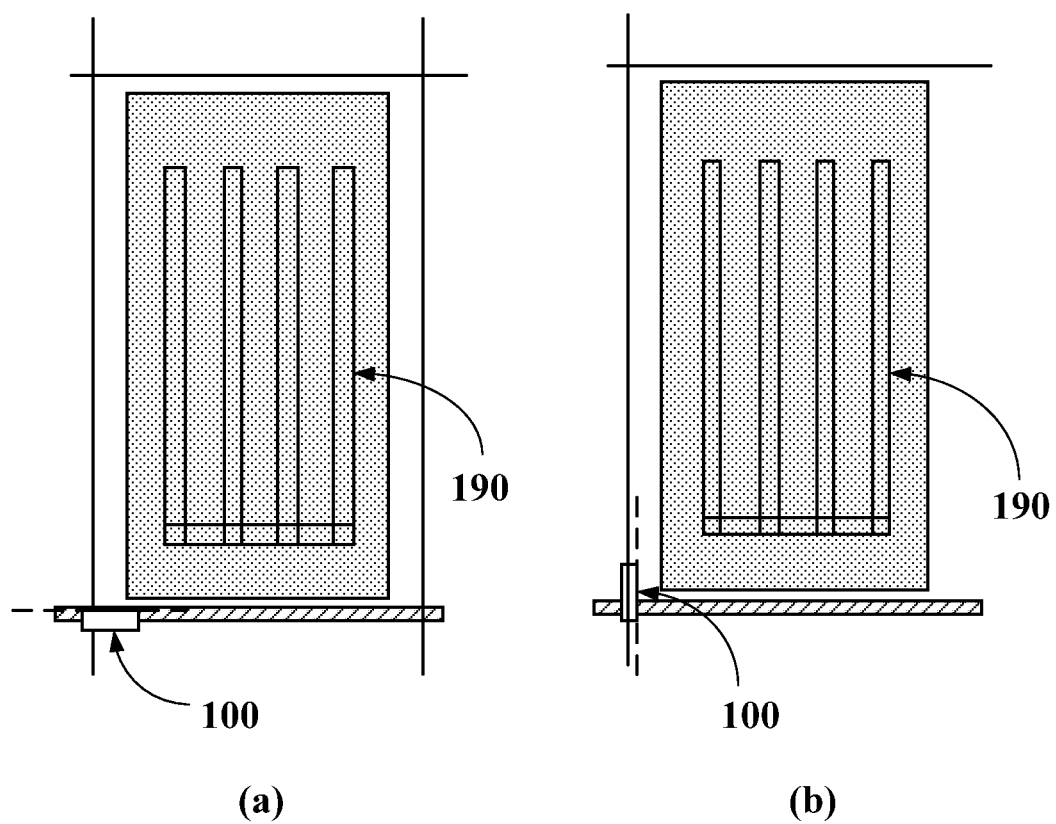
FIG. 3(a) shows a first deployment diagram of the first aspect of the lateral gate electrode TFT of the first embodiment of the present invention.
FIG. 3(b) shows a second deployment diagram of the first aspect of the lateral gate electrode TFT of the first embodiment of the present invention.

Please refer to FIGS. 3(a) and 3(b). FIG. 3(a) shows a first deployment diagram of the first aspect of the lateral gate electrode TFT 100 of a first embodiment of the present invention. FIG. 3(b) shows a second deployment diagram of the first aspect of the lateral gate electrode TFT 100 of a first embodiment of the present invention. The disposing direction of the source-drain area 180 of the lateral gate TFT 100 is able to be disposed in horizontal direction, as shown in FIG. 3(a), or in a vertical direction, as shown in FIG. 3(b), according to different needs of the pixel 190. In another preferred embodiment, the conductive channel could be bent in a horizontal line.

FIG. 4 shows a manufacturing process of the lateral gate electrode TFT 100 of the first embodiment of the present invention. Please note that this flow chart is used to describe the manufacturing process of the lateral gate TFT 100, but does not describe the position of each element of the lateral gate TFT 100. A first metal layer D/S (for forming a source electrode 110), a first ohm-contact layer 130, an active layer 140, a second ohm-contact layer 130' and a second metal layer S/D (for forming a drain electrode 120) are disposed on the substrate 170, sequentially. The first ohm-contact layer 130 and the second ohm-contact layer 130' have the same or different materials. Then, a source-drain area 180, which comprises the source electrode 110, the first ohm-contact layer 130, the second ohm-contact layer 130' and the active layer 140, is completed in its manufacture. Then, a gate insulation layer 150 is formed beside the source-drain area 180 on the substrate 170, and a third metal layer, which is used to form a gate electrode 160, is disposed beside the gate insulation layer 150. The purpose of the gate insulation layer 150 is to make the gate electrode 160 and the source-drain area 180 insulated.

In the present invention, only one or two ohm-contact layers is/are mentioned as exemplars, but in other embodiments, it is possible to have more than 2 ohm-contact layers.

Figure 5:
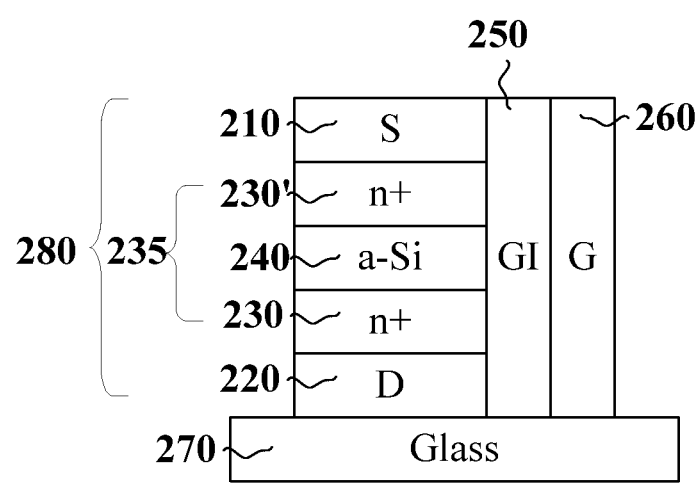
FIG. 5 shows a manufacturing process of the lateral gate electrode TFT of a second embodiment of the present invention.

FIG. 5 shows a manufacturing process of the lateral gate electrode TFT of a second embodiment of the present invention. The difference between the lateral gate TFT 200 of the second embodiment and the lateral gate TFT 100 of the first embodiment is: that a drain electrode 220 is disposed directly on the substrate 270. More specifically, with reference to the substrate 270, the drain electrode 220, the first ohm-contact layer 230, the active layer 240, the second ohm-contact layer 230' and the source electrode 210 are disposed along a vertical direction, sequentially, to form the source-drain area 280. With reference to the substrate 270, the source-drain area 280, the gate insulation layer 250, and the gate electrode 260 are disposed along a horizontal direction, sequentially.

Figure 6:
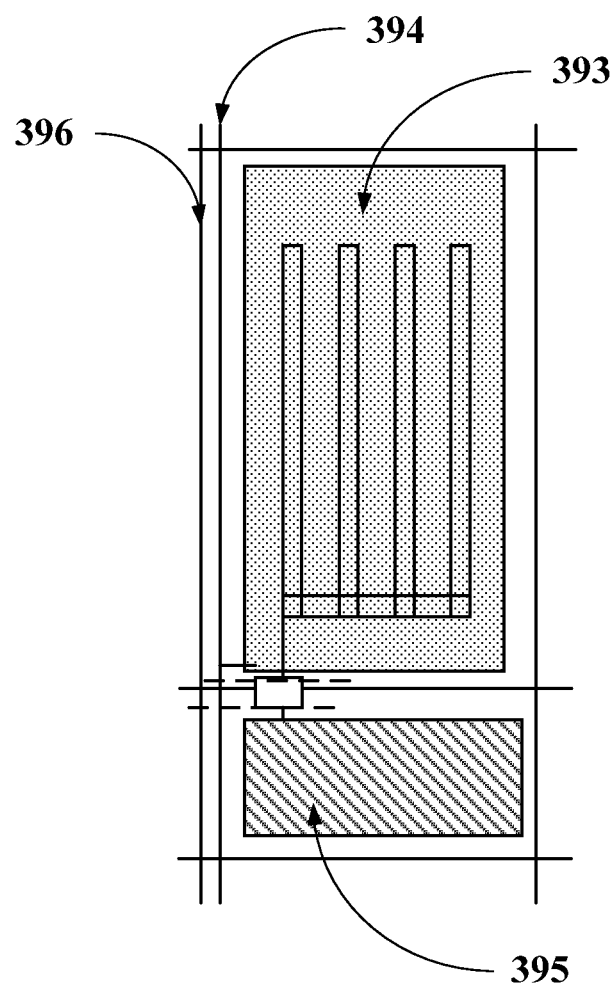
FIG. 6 shows a deployment diagram of the lateral gate electrode TFT of a third embodiment of the present invention.
Figure 7:
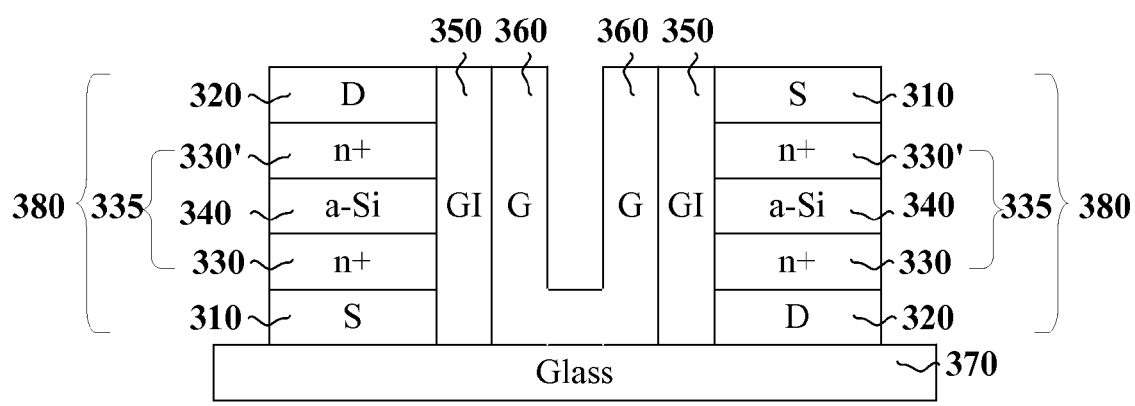
FIG. 7 shows a detailed structural diagram of the lateral gate electrode TFT of the third embodiment of the present invention.
Figure 8:
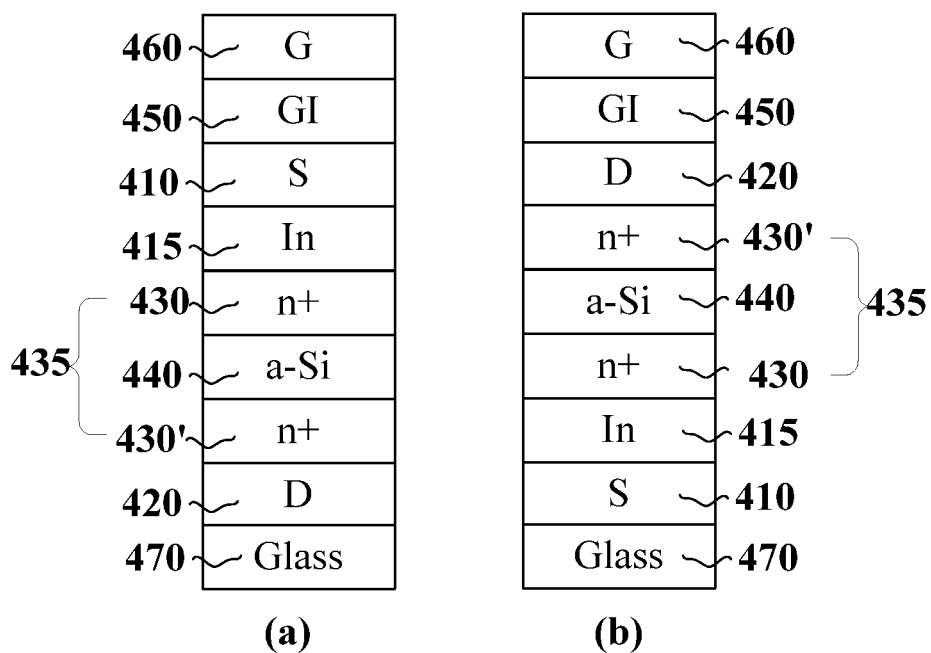
FIG. 8(a) shows a manufacturing process of the first aspect of the lateral gate electrode TFT of a fourth embodiment of the present invention.
FIG. 8(b) shows a manufacturing process of a second aspect of the lateral gate electrode TFT of the fourth embodiment of the present invention.

Please refer to FIGS. 6 and 7. FIG. 6 shows a deployment diagram of the lateral gate electrode TFT of a third embodiment of the present invention. FIG. 7 shows a detailed structural diagram of the lateral gate electrode TFT of the third embodiment of the present invention. The embodiment combines the structures of the first embodiment and the second embodiment. The two gate electrode 360 of the two lateral gate electrode TFTs 300 are connected to each other. In the embodiment, one of the two lateral gate electrode TFTs 300 connects to a first data line 396 and a sub pixel 395, the other of the two lateral gate electrode TFTs 300 connects to a second data line 394 and a main pixel 393. With this arrangement, two data lines (top and bottom data lines) are able to be insulated by the active layer while being applied to adjacent row pixels or adjacent column pixels. Because the gate electrodes of the adjacent lateral gate electrode TFT are able to be manufactured together, the aperture ratio and the charging capability are raised.

Please refer to FIGS. 8(a) and 8(b). FIG. 8(a) shows a manufacturing process of the first aspect of the lateral gate electrode TFT 400 of a fourth embodiment of the present invention. FIG. 8(b) shows a manufacturing process of the second aspect of the lateral gate electrode TFT 400 of the fourth embodiment of the present invention. The difference between the lateral gate TFT 400 of the fourth embodiment and the lateral gate TFT 100 of the first embodiment is that one manufacturing process is performed more between the source electrode 410 and the semiconductor layer 435, an insulation layer 415 is formed more by the manufacturing process. As shown in FIG. 8(a), a second metal layer (for forming a drain electrode 420), a first ohm-contact layer 430, an active layer 440, a second ohm-contact layer 430', the insulation layer 415, a first metal layer (for forming a source electrode 410) and the gate insulation layer are disposed on the substrate 470, sequentially. The first ohm-contact layer 430 and the second ohm-contact layer 430' have the same or different materials. The difference between FIGS. 8(b) and 8(a) is: that the sequence of manufacturing the insulation layer 415 is different. For the rest of the process, please refer to the description of FIG. 8(a). In the manufacturing process, after the semiconductor layer 435 is formed, then the insulation layer 415 is formed. Then the insulation layer 415 is etched, the source electrode 410 is formed, so that the insulation layer 415 is disposed between the source electrode 410 and the semiconductor layer 435, and a conductive channel is formed on a portion, without disposition of the insulation layer 415, between the source electrode 410 and the semiconductor layer 435. In the structure of dual data lines, especially for top and bottom data lines, with the disposition of the insulation layer 415, the source electrode 410 in FIG. 8(a) is connected to one data line and the source electrode 410 of FIG. 8(b) is connected to another data line without mutual interference. The source electrode 410 and the drain electrode 420 use the conductive channel to transmit current, while the gate electrode 460 is applied with a driving voltage.

The other embodiments of the present invention also provide a liquid display device which comprises the lateral gate TFT switch as mentioned above.

Although the present invention has been disclosed as preferred embodiments, the foregoing preferred embodiments are not intended to limit the present invention. Those of ordinary skill in the art, without departing from the spirit and scope of the present invention, can make various kinds of modifications and variations to the present invention. Therefore, the scope of the claims of the present invention must be defined.

What is claimed is:

1. A lateral gate electrode TFT (Thin Film Transistor) switch, comprising:
   a substrate;
   a source-drain area which is disposed on the substrate and comprises a source electrode, a drain electrode and a semiconductor layer, the semiconductor layer being disposed between the source electrode and the drain electrode, the source electrode and the drain electrode being vertically disposed on the substrate;
   a gate insulation layer disposed adjacent to the source-drain area;
   a gate electrode disposed adjacent to the gate insulation layer,
   wherein the gate insulation layer is used to separate the source-drain area from the gate electrode, the semiconductor layer comprises a first ohm-contact layer, an active layer and a second ohm-contact layer, the active layer is disposed between the first ohm-contact layer and the second ohm-contact layer; and
   an insulation layer disposed between the source electrode and the semiconductor layer, a conductive channel is formed on a portion, without disposition of the insulation layer, between the source electrode and the semiconductor layer.

2. The lateral gate electrode TFT switch according to claim 1, wherein the gate insulation layer and the gate electrode are disposed directly on the substrate.

3. The lateral gate electrode TFT switch according to claim 1, wherein the first ohm-contact layer and the second ohm-contact layer have the same or different materials.

4. The lateral gate electrode TFT switch according to claim 1, wherein the source electrode directly contacts with the substrate.

5. The lateral gate electrode TFT switch according to claim 1, wherein the drain electrode directly contacts with the substrate.

6. The lateral gate electrode TFT switch according to claim 1, wherein the source electrode and the drain electrode transmit current via the conductive channel, while the gate electrode is applied with a driving voltage.

7. A lateral gate electrode TFT switch, comprising:
   a substrate;
   a source-drain area which is disposed on the substrate and comprises a source electrode, a drain electrode and a semiconductor layer, the semiconductor layer being disposed between the source electrode and the drain electrode, the source electrode and the drain electrode being vertically disposed on the substrate;
   a gate insulation layer disposed adjacent to the source-drain area;
   a gate electrode disposed adjacent to the gate insulation layer,
   wherein the gate insulation layer is used to separate the source-drain area from the gate electrode, and the semiconductor layer comprises a first ohm-contact layer, an active layer and a second ohm-contact layer; and
   an insulation layer disposed between the source electrode and the semiconductor layer, a conductive channel is formed on a portion, without disposition of the insulation layer, between the souce electrode and the semiconductor layer.

8. The lateral gate electrode TFT switch according to claim 7, wherein the gate insulation layer and the gate electrode are disposed directly on the substrate.

9. The lateral gate electrode TFT switch according to claim 7, wherein the first ohm-contact layer and the second ohm-contact layer have the same or different materials.

10. The lateral gate electrode TFT switch according to claim 7, wherein the source electrode directly contacts with the substrate.

11. The lateral gate electrode TFT switch according to claim 7, wherein the drain electrode directly contacts with the substrate.

12. The lateral gate electrode TFT switch according to claim 7, wherein the source electrode and the drain electrode transmit current via the conductive channel, while the gate electrode is applied with a driving voltage.

13. A liquid crystal display device, which comprises a lateral gate electrode TFT switch which comprises:
   a substrate;
   a source-drain area which is disposed on the substrate and comprises a source electrode, a drain electrode and a semiconductor layer, the semiconductor layer being disposed between the source electrode and the drain electrode, the source electrode and the drain electrode being vertically disposed on the substrate;
   a gate insulation layer disposed adjacent to the source-drain area;
   a gate electrode disposed adjacent to the gate insulation layer,
   wherein the gate insulation layer is used to separate the source-drain area from the gate electrode, and the semiconductor layer comprises a first ohm-contact layer, an active layer and a second ohm-contact layer; and
   an insulation layer disposed between the source electrode and the semiconductor layer, and a conductive channel is formed on a portion, without disposition of the insulation layer, between the source electrode and the semiconductor layer.

* * * * *